(12) United States Patent
Ju

(10) Patent No.: US 8,192,206 B1
(45) Date of Patent: Jun. 5, 2012

(54) ELECTRICAL CONNECTOR

(75) Inventor: Ted Ju, Keelung (TW)

(73) Assignee: Lotes Co., Ltd., Keelung (TW)

( * ) Notice: Subject to any disclaimer, the term of this patent is extended or adjusted under 35 U.S.C. 154(b) by 0 days.

(21) Appl. No.: 13/159,847

(22) Filed: Jun. 14, 2011

(30) Foreign Application Priority Data

Jan. 24, 2011 (CN) ...................... 2011 2 0023079 U

(51) Int. Cl.
*H01R 12/00* (2006.01)
(52) U.S. Cl. ........................................... 439/66; 439/92
(58) Field of Classification Search ..................... 439/65, 439/66, 71, 78, 81, 83, 92, 108, 862
See application file for complete search history.

(56) References Cited

U.S. PATENT DOCUMENTS

| | | | |
|---|---|---|---|
| 6,877,998 B1* | 4/2005 | Kim et al. | 439/108 |
| 7,922,548 B2* | 4/2011 | Fan | 439/862 |
| 7,955,091 B2* | 6/2011 | McClellan et al. | 439/71 |
| 7,972,149 B2* | 7/2011 | Ihara | 439/81 |
| 8,052,454 B2* | 11/2011 | Polnyi | 439/342 |

* cited by examiner

*Primary Examiner* — Khiem Nguyen
(74) *Attorney, Agent, or Firm* — Morris Manning & Martin LLP; Tim Tingkang Xia, Esq.

(57) ABSTRACT

An electrical connector for electrically connecting to a circuit board. In one embodiment, the electrical connector includes: an insulating body, having at least one grounding terminal slot and a plurality of signal terminal slots, at least one grounding terminal, made of a flexible conductive material and accommodated in the grounding terminal slot, and including a first base and a first soldering portion accommodated in the grounding terminal slot in a suspended manner, a plurality of signal terminals, and a plurality of solder balls, at least one of which is disposed on the first soldering portion.

10 Claims, 5 Drawing Sheets

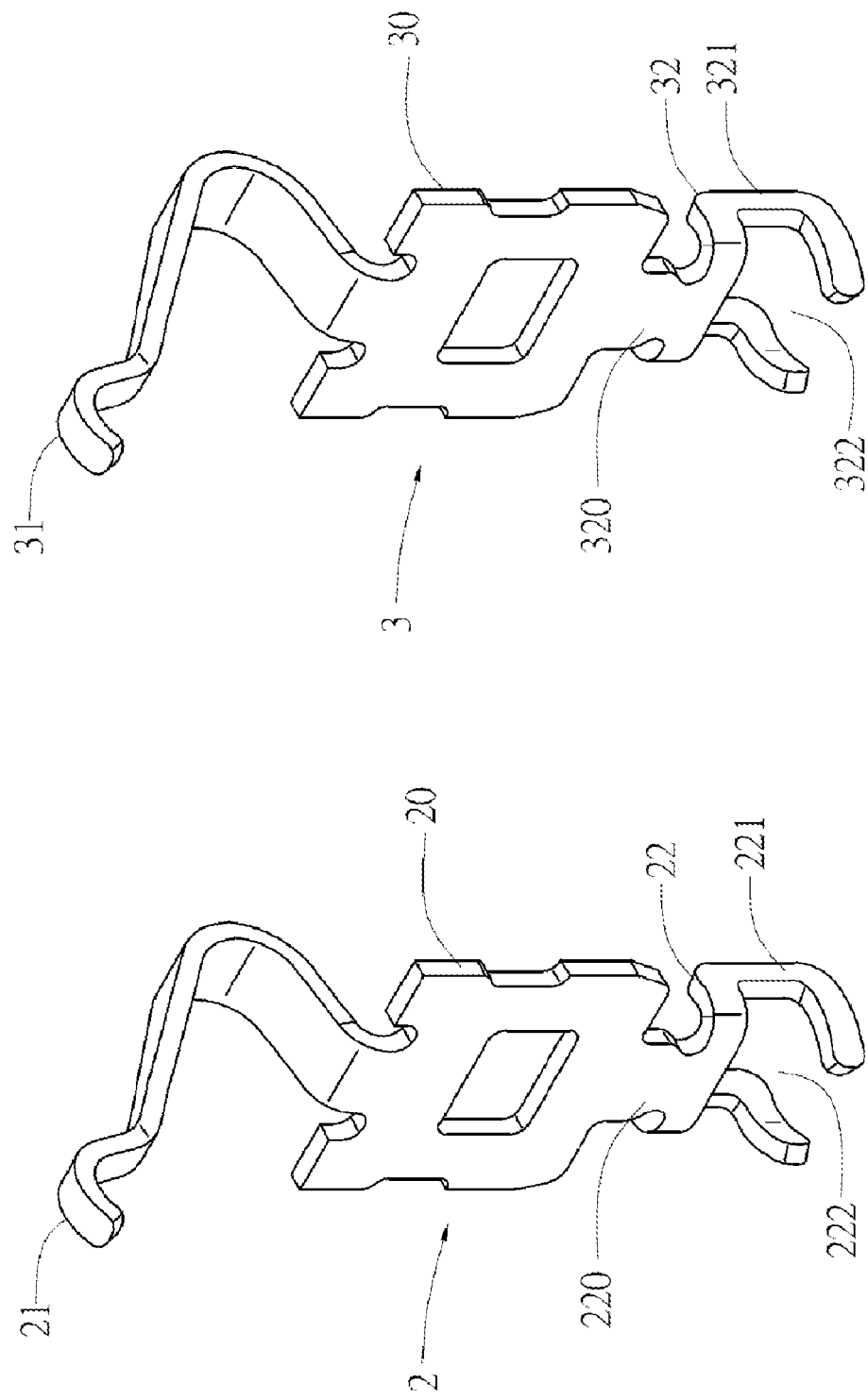

ELECTRICAL CONNECTOR

CROSS-REFERENCE TO RELATED APPLICATION

This non-provisional application claims priority under 35 U.S.C. §119(a) on Patent Application No. 201120023079.1 filed in China on Jan. 24, 2011, the entire contents of which are hereby incorporated by reference.

FIELD OF THE INVENTION

The present invention relates to an electrical connector, and more particularly to an electrical connector for electrically connecting a chip module to a circuit board.

BACKGROUND OF THE INVENTION

Currently, an electrical connector for electrically connecting a chip module to a circuit board in the prior art includes an insulating body, a plurality of signal terminal slots formed through the insulating body, wherein a shielding layer is disposed in the signal terminal slot, a recessed portion is disposed at a bottom surface of the insulating body, and the recessed portion has a metal layer electrically conducted with the shielding layer, a plurality of signal terminals, respectively accommodated in the signal terminal slots, a grounding sheet, accommodated in the recessed portion, wherein a part of the grounding sheet located in the recessed portion is in full contact with an inner wall of the recessed portion, and a plurality of solder balls, wherein one of the solder balls is securely mounted on the grounding sheet, and the grounding sheet and the circuit board are soldered and conducted.

The grounding sheet is placed in the recessed portion. In order to prevent the grounding sheet from falling off from the recessed portion due to gravity and vibration during transportation, it is a common method to increase the contact area of the grounding sheet and the recessed portion, wherein the part of the grounding sheet located in the recessed portion needs to be in full contact with the inner wall of the recessed portion.

However, the above method incurs the following problems.

When the solder ball is soldered, when the electrical connector generates heat during operation, or when the electrical connector is in an environment of extreme temperature, both the insulating body and the circuit board undergo expansion. As the material of the insulating body and the material of the circuit board have different expansion coefficients, the insulating body and the circuit board undergo different degrees of expansion. Therefore, the recessed portion disposed on the bottom surface of the insulating body is displaced relative to the circuit board, and accordingly the grounding sheet accommodated in the recessed portion and the solder ball disposed corresponding to the grounding sheet are displaced relative to the circuit board, thus the solder ball is displaced relative to the corresponding solder joint on the circuit board, which causes a solder cracking phenomenon.

Therefore, a heretofore unaddressed need exists in the art to address the aforementioned deficiencies and inadequacies.

SUMMARY OF THE INVENTION

In one aspect, the present invention is directed to an electrical connector, which can prevent solder cracking. In one embodiment, the present invention adopts the following technical solution.

An electrical connector includes an insulating body, at least one grounding terminal, a plurality of signal terminals and a plurality of solder balls. The insulating body has at least one grounding terminal slot and a plurality of signal terminal slots formed through the insulating body. The grounding terminal slot has a first retaining slot and a first reserved slot under the first retaining slot. At least one first metal layer is laid on an inner wall of the first retaining slot and an inner wall of the first reserved slot. Each signal terminal slot has a second retaining slot and a second reserved slot under the second retaining slot. A second metal layer is laid on an inner wall of each second reserved slot, and the first metal layer and the second metal layer are conducted. The grounding terminal is made of a flexible conductive material and accommodated in the grounding terminal slot, and includes a first base conducted to the first metal layer and fixed in the first retaining slot and a first soldering portion extending downwards from the first base and suspended in the first reserved slot. The signal terminals are respectively accommodated in the signal terminal slots, and each signal terminal has a second base fixed in the second retaining slot and a second soldering portion extending downwards from the second base and suspended in the second reserved slot. The solder balls are respectively positioned at the first soldering portion and the second soldering portions.

Compared with the prior art, in one aspect of the present invention, the grounding terminal is made of a flexible conductive material, and the first soldering portion is accommodated in the first reserved slot in a suspended manner. As such, when the solder ball is soldered, when the electrical connector generates heat during operation, or when the electrical connector is in an environment of extreme temperature, even if the grounding terminal slot is displaced relative to the circuit board, the first soldering portion may undergo large bending deformation to compensate the displacement of the grounding terminal slot relative to the circuit board, thereby preventing a large displacement of the tail end of the first soldering portion and the solder ball relative to the circuit board. Therefore, the solder cracking phenomenon will not occur.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the invention and together with the written description, serve to explain the principles of the invention. Wherever possible, the same reference numbers are used throughout the drawings to refer to the same or like elements of an embodiment, and wherein:

FIG. 3 is a perspective view of a grounding terminal of the electrical connector in one embodiment of the present invention;

FIG. 4 is a perspective view of a signal terminal of the electrical connector in one embodiment of the present invention;

LIST OF REFERENCE NUMERALS IN FIGS. 1-6

Figure 1:
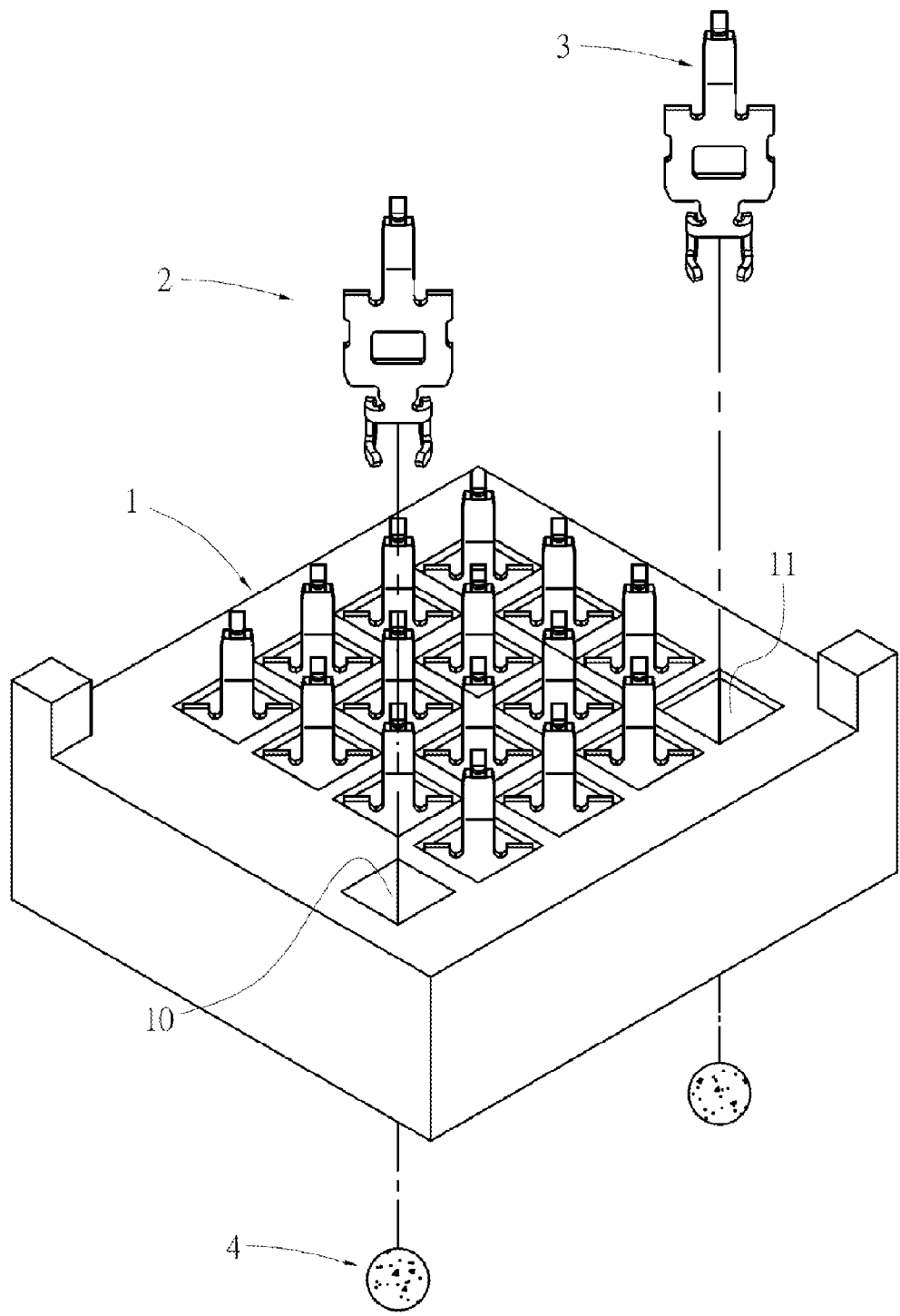
FIG. 1 is an exploded view of an electrical connector in one embodiment of the present invention.

| | | | |
|---|---|---|---|
| Insulating body | 1 Grounding terminal slot | 10 First retaining slot | 100 |
| First reserved slot | 101 First metal layer | 102 Signal terminal slot | 11 |
| Second retaining slot | 110 Second reserved slot | 111 Second metal layer | 112 |
| Third metal layer | 12 | | |
| Grounding terminal | 2 First base | 20 First contact portion | 21 |
| First soldering portion | 22 First connecting portion | 220 First clamping arm | 221 |
| First clamping space | 222 | | |
| Signal terminal | 3 Second base | 30 Second contact portion | 31 |
| Second soldering portion | 32 Second connecting portion | 320 Second clamping arm | 321 |
| Second clamping space | 322 | | |
| Solder ball | 4 | | |
| Circuit board | 5 First solder joint | 50 Second solder joint | 51 |
| Solder paste | 6 | | |

DETAILED DESCRIPTION OF THE INVENTION

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise.

Figure 2:
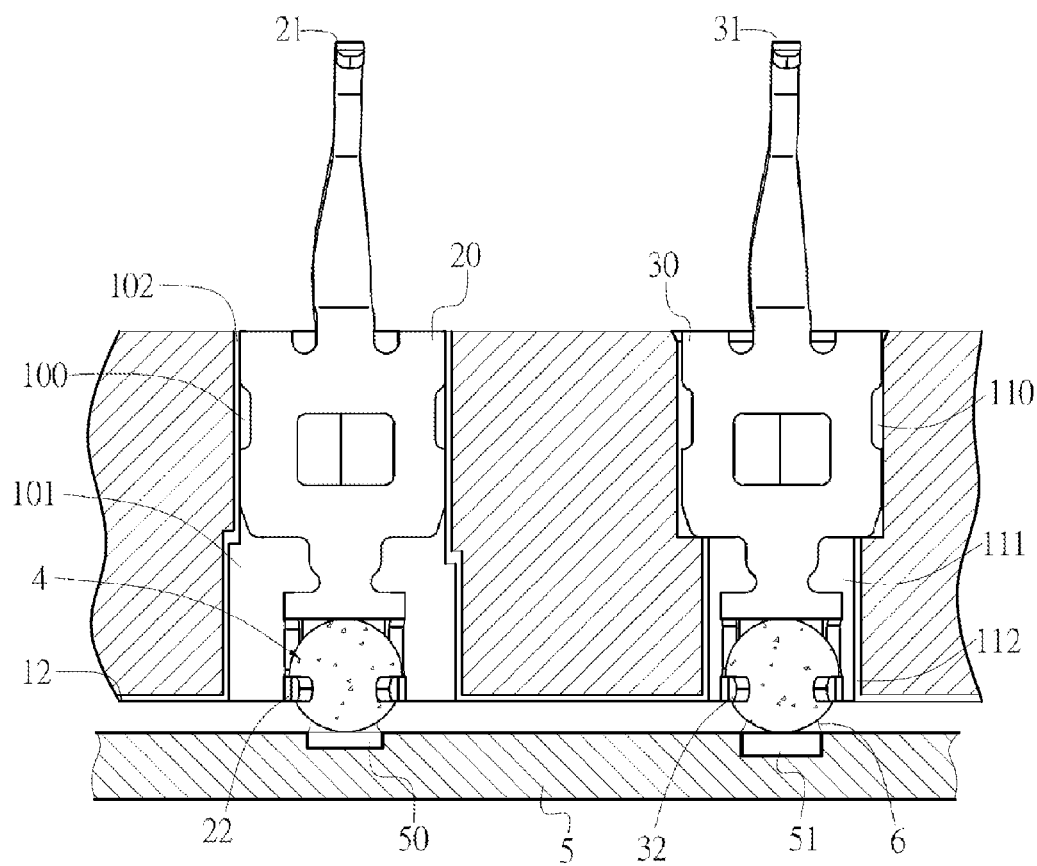
FIG. 2 is a schematic sectional view of the electrical connector in one embodiment of the present invention.

Referring to FIG. 1 and FIG. 2, the electrical connector of the present invention includes an insulating body 1, a grounding terminal 2, a plurality of signal terminals 3 and a plurality of solder balls 4. The electrical connector is used for electrically connecting a chip module (not shown) to a circuit board 5. The circuit board 5 has a first solder joint 50 corresponding to the grounding terminal 2 and a plurality of second solder joints 51 respectively corresponding to the signal terminals 3.

Referring to FIG. 1 and FIG. 2, the insulating body 1 includes a grounding terminal slot 10 and a plurality of signal terminal slots 11 formed through the insulating body 1. The grounding terminal slot 10 has a first retaining slot 100 and a first reserved slot 101 under the first retaining slot 100. Four inner side surfaces of the first reserved slot 101 are further recessed into the insulating body 1 than four inner side surfaces of the corresponding first retaining slot 100. A first metal layer 102 is laid on an inner wall of the first retaining slot 100 and an inner wall of the first reserved slot 101.

Each signal terminal slot 11 has a second retaining slot 110 and a second reserved slot 111 under the second retaining slot 110. A second metal layer 112 is laid on an inner wall of each second reserved slot 111. In other embodiments (not shown), the second metal layer 112 is laid on an inner wall of the second retaining slot 110, and an insulating layer (not shown) is laid on the second metal layer 112. The first metal layer 102 and the second metal layer 112 are conducted.

A third metal layer 12 is plated on a bottom surface of the insulating body 1. In other embodiments (not shown), the third metal layer 12 may be plated on a top surface of the insulating body 1. The third metal layer 12 electrically conducts the first metal layer 102 and the second metal layer 112.

Referring to FIGS. 2-4, the grounding terminal 2 is accommodated in the grounding terminal slot 10, and the grounding terminal 2 is made of a flexible conductive material. The grounding terminal 2 has the same shape and structure as the signal terminals 3. The grounding terminal 2 includes a first base 20, conducted to the first metal layer 102 and fixed in the first retaining slot 100 and in interference-fit with the first retaining slot 100, a first contact portion 21, bent and extending upwards from the first base 20 and exposed outside the insulating body 1, and used for electrically connecting a chip module (not shown), and a first soldering portion 22, bent and extending downwards from the first base 20 and suspended in the first reserved slot 101, and used for being conducted to the circuit board 5, thereby grounding the second metal layer 112 and the chip module (not shown). The first soldering portion 22 includes a first connecting portion 220 connected to the first base 20, and two first clamping arms 221 extending from a lower end of the first connecting portion 220 and used for clamping the solder ball 4. The two first clamping arms 221 are formed by firstly bending and extending backwards from two opposite free ends of the first connecting portion 220, then bending and extending downwards and finally bending and extending forwards. The lower end of the first connecting portion 220 and the two first clamping arms 221 jointly define a first clamping space 222 to accommodate the solder ball 4, and the lower end of the first connecting portion 220 stops an upward displacement of the solder ball 4.

The signal terminals 3 are respectively accommodated in the signal terminal slots 11. Each signal terminal 3 includes a second base 30, fixed in the second retaining slot 110 and in interference-fit with the second retaining slot 110, a second contact portion 31, bent and extending upwards from the second base 30 and exposed outside the insulating body 1, and used for being electrically connected to a chip module (not shown), and a second soldering portion 32, bent and extending downwards from the second base 30 and suspended in the second reserved slot 111, that is, the second soldering portion 32 is not in contact with the second reserved slot 111. The second soldering portion 32 includes a second connecting portion 320 connected to the second base 30, and two second clamping arms 321 extending from a lower end of the second connecting portion 320 and used for clamping the solder ball 4. The two second clamping arms 321 are formed by firstly bending and extending backwards from two opposite free ends of the second connecting portion 320, then bending and extending downwards and finally bending and extending forwards. The lower end of the second connecting portion 320 and the two second clamping arms 321 jointly define a second clamping space 322 to accommodate the solder ball 4, and the lower end of the second connecting portion 320 stops an upward displacement of the solder ball 4.

Referring to FIG. 1 and FIG. 2, the solder balls 4 are respectively installed and fixed in the first clamping space 222 of the first soldering portion 22 and the second clamping spaces 322 of the second soldering portions 32. The first soldering portion 22 and the second soldering portion 32 are respectively soldered and conducted to the first solder joint 50 and the second solder joint 51. The solder ball 4 is also suspended, that is, the solder ball 4 is not in contact with the first reserved slot 101 or the second reserved slot 111.

Figure 5:
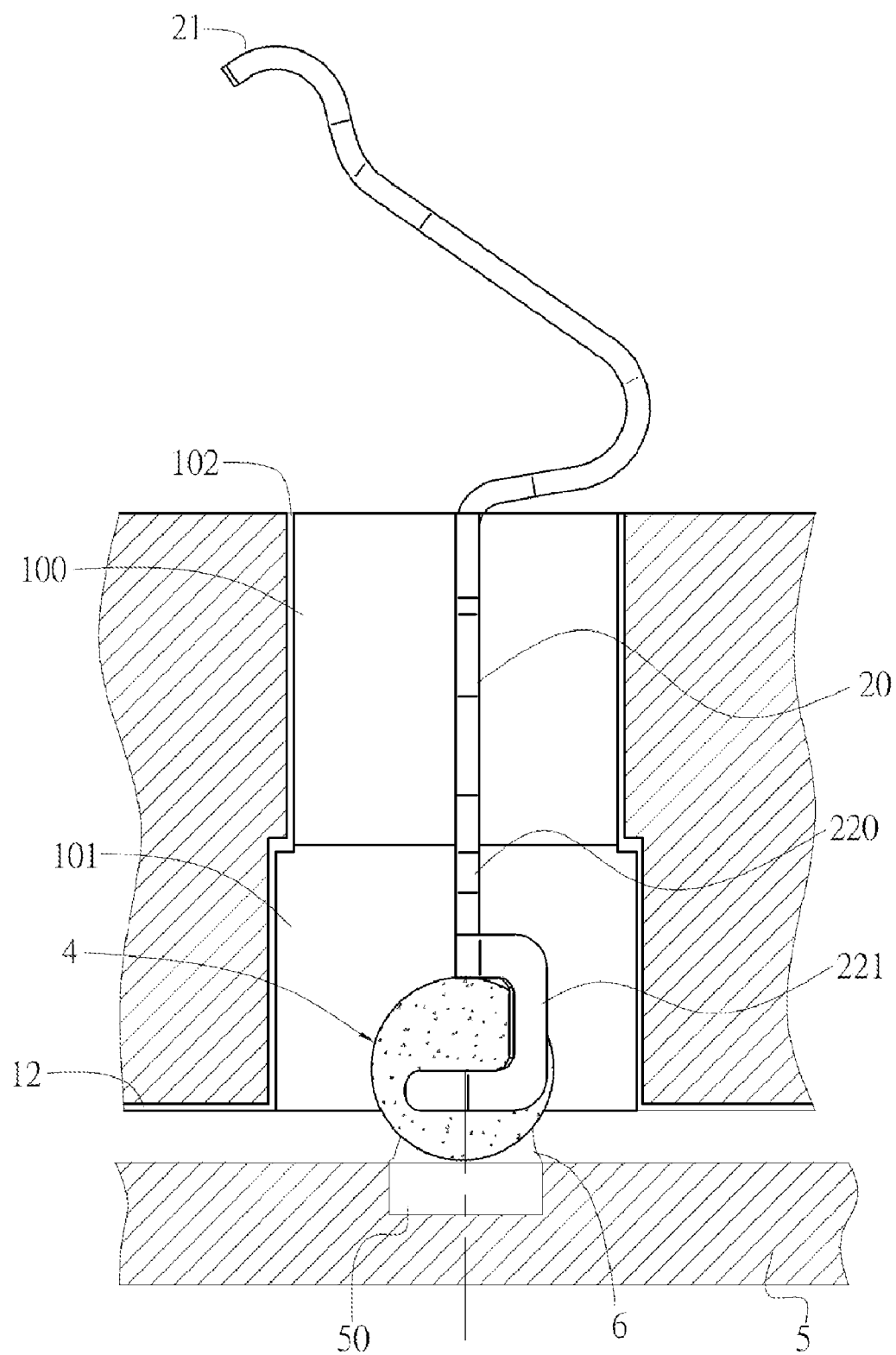
FIG. 5 is a schematic view of the grounding terminal before soldering of the electrical connector in one embodiment of the present invention.
Figure 6:
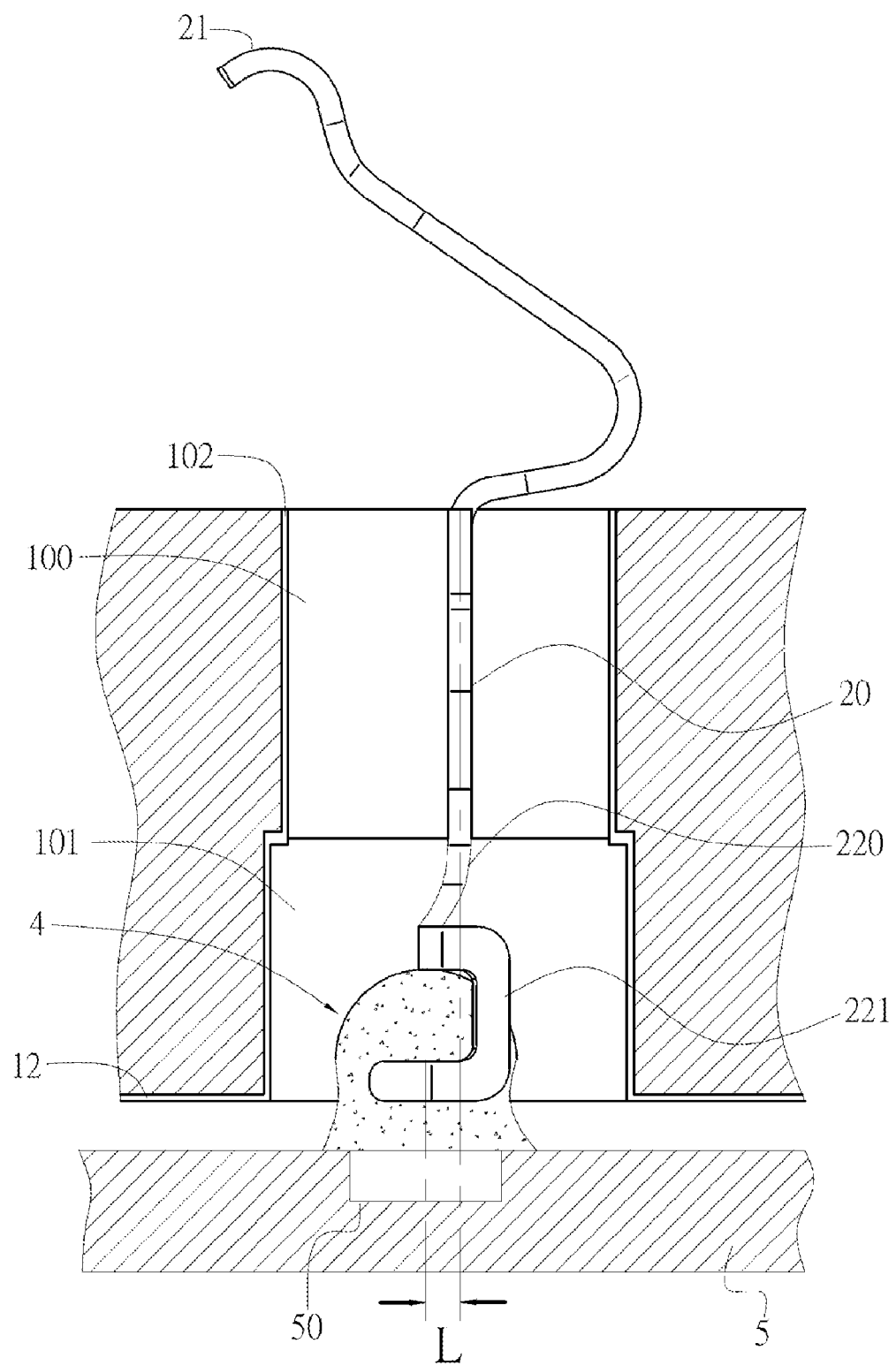
FIG. 6 is a schematic view of the grounding terminal during soldering of the electrical connector in one embodiment of the present invention.

Referring to FIG. 5 and FIG. 6, the changes of the grounding terminal 2 when the electrical connector is soldered are described as follows.

Before soldering, the center of the grounding terminal slot 10 substantially coincides with the center of the first solder joint 50, the solder ball 4 is installed in the first clamping space 222 of the first soldering portion 22, a lower end of the solder ball 4 exceeds the first soldering portion 22 and the insulating body 1, and a lower end of the solder ball 4 is fixed to the first solder joint 50 by a solder paste 6 in advance.

During soldering, as both the insulating body 1 and the circuit board 5 undergo expansion due to high temperature, the grounding terminal slot 10 is contracted towards a central line, and the first solder joint 50 is displaced towards the circuit board 5. At this time, the central line of the grounding terminal 2 and the central line of the first solder joint 50 undergo a large displacement L. As the grounding terminal 2 is made of a flexible conductive material and the first reserved slot 101 has a large space, the first connecting portion 220 undergoes bending deformation, so that the solder ball 4 is not greatly displaced relative to the first solder joint 50, thereby preventing solder cracking.

Based on the above, the electrical connector of the present invention, among other things, has the following beneficial effects.

1. When the solder ball is soldered, when the electrical connector generates heat during operation, or when the electrical connector is in an environment of extreme temperature, as the insulating body and the circuit board are made of different materials, the insulating body and the circuit board undergo different degrees of expansion, so that the grounding terminal slot is displaced relative to the first solder joint. As the grounding terminal is made of a flexible conductive material and the first soldering portion is suspended in the first reserved slot, the first connecting portion undergoes bending deformation to compensate the displacement of the grounding terminal slot relative to the first solder joint, thereby ensuring a good connection of the solder ball and the first solder joint without causing solder cracking 2. The four inner side surfaces of the first reserved slot are further recessed towards the insulating body than the four inner side surfaces of the corresponding retaining slot, so the first reserved slot provides enough space for the first soldering portion to prevent the first soldering portion from urging against the insulating body while undergoing deformation to cause a displacement between the solder ball and the first solder joint and further cause solder cracking 3. The grounding terminal has the same structure and shape as the signal terminals, so no new equipment is required for manufacturing the grounding terminal, thereby reducing the cost.

4. The first contact portion and the chip module are in electrical contact, so the electrostatic charge of the chip module can be grounded.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments are chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An electrical connector, comprising:
    an insulating body, having at least one grounding terminal slot and a plurality of signal terminal slots formed through the insulating body, wherein the grounding terminal slot has a first retaining slot and a first reserved slot under the first retaining slot, at least one first metal layer is laid on an inner wall of the first retaining slot and an inner wall of the first reserved slot, each signal terminal slot has a second retaining slot and a second reserved slot under the second retaining slot, a second metal layer is laid on an inner wall of each second reserved slot, and the first metal layer and the second metal layer are conducted;
    at least one grounding terminal, made of a flexible conductive material, accommodated in the grounding terminal slot, and comprising a first base conducted to the first metal layer and fixed in the first retaining slot and a first soldering portion extending downwards from the first base and suspended in the first reserved slot;
    a plurality of signal terminals, respectively accommodated in the signal terminal slots, wherein each signal terminal has a second base fixed in the second retaining slot and a second soldering portion extending downwards from the second base and suspended in the second reserved slot; and
    a plurality of solder balls, respectively positioned at the first soldering portion and the second soldering portions.

2. The electrical connector according to claim 1, further comprising a third metal layer laid on a bottom surface of the insulating body and conducting the first metal layer and second metal layer.

3. The electrical connector according to claim 1, further comprising a third metal layer laid on a top surface of the insulating body and conducting the first metal layer and the second metal layer.

4. The electrical connector according to claim 1, wherein the second metal layer is further laid on an inner wall of the second retaining slot, an insulating layer is laid on the second metal layer, and the second base contacts the insulating layer.

5. The electrical connector according to claim 1, wherein the grounding terminal and the signal terminals have the same shape and structure.

6. The electrical connector according to claim 1, wherein the first base and the first retaining slot are in interference-fit, and the second base and the second retaining slot are in interference-fit.

7. The electrical connector according to claim 1, wherein a first contact portion extends upwards from the first base and is exposed outside the insulating body, and a second contact portion extends upwards from the second base is exposed outside the insulating body.

8. The electrical connector according to claim 1, wherein the first soldering portion comprises a first connecting portion connected to the first base and two first clamping arms extending from a lower end of the first connecting portion and used for clamping the solder ball.

9. The electrical connector according to claim 8, wherein the two first clamping arms are formed by firstly bending and extending backwards from two opposite free ends of the first connecting portion, then bending and extending downwards and finally bending and extending forwards.

10. The electrical connector according to claim 8, wherein the lower end of the first connecting portion and the two first clamping arms jointly define a first clamping space for accommodating the solder ball, and the lower end of the first connecting portion stops an upward displacement of the solder ball.

* * * * *